United States Patent [19]

Steckner

[11] Patent Number: 6,064,208

[45] Date of Patent: May 16, 2000

[54] TWO-PEAK ALIGNMENT METHOD OF FIELD SHIMMING

[75] Inventor: Michael Steckner, Mayfield Heights, Ohio

[73] Assignee: Picker International, Inc., Highland Heights, Ohio

[21] Appl. No.: 09/053,933

[22] Filed: Apr. 2, 1998

[51] Int. Cl.[7] .................................................. G01V 3/00
[52] U.S. Cl. ...................... 324/320; 324/319; 324/300; 128/653.5
[58] Field of Search .................................. 324/320, 300, 324/319, 309, 307, 318; 128/653.5

[56] References Cited

U.S. PATENT DOCUMENTS

| | | |
|---|---|---|
| 4,523,166 | 6/1985 | Goss . |
| 4,585,992 | 4/1986 | Maudsley et al. . |
| 4,623,844 | 11/1986 | Macovski . |
| 4,672,318 | 6/1987 | Sekihara et al. . |
| 4,672,320 | 6/1987 | Sekihara et al. . |
| 4,680,551 | 7/1987 | O'Donnell et al. . |
| 4,684,889 | 8/1987 | Yamaguchi et al. . |
| 4,684,893 | 8/1987 | Kojima et al. . |
| 4,700,136 | 10/1987 | Yamaguchi et al. . |
| 4,710,715 | 12/1987 | Mee et al. . |
| 4,740,753 | 4/1988 | Glover et al. . |
| 4,749,948 | 6/1988 | Duby et al. . |
| 4,761,614 | 8/1988 | Prammer et al. . |
| 4,812,765 | 3/1989 | Aubert . |
| 4,899,109 | 2/1990 | Tropp et al. . |
| 4,931,733 | 6/1990 | Hanawa . |
| 4,945,446 | 7/1990 | Kuroda . |
| 4,987,371 | 1/1991 | Glover et al. . |
| 5,055,791 | 10/1991 | LeRoux et al. . |
| 5,121,060 | 6/1992 | Doddrell et al. . |
| 5,168,232 | 12/1992 | Glover et al. . |
| 5,345,178 | 9/1994 | Manabe et al. . |
| 5,359,289 | 10/1994 | van der Meulen . |
| 5,371,465 | 12/1994 | Onodera et al. . |
| 5,373,239 | 12/1994 | Marek et al. . |
| 5,391,990 | 2/1995 | Schmitt et al. . |
| 5,530,352 | 6/1996 | Kolem . |
| 5,539,316 | 7/1996 | Sukumar . |
| 5,592,091 | 1/1997 | Manabe . |
| 5,602,480 | 2/1997 | Onodera et al. . |
| 5,614,827 | 3/1997 | Heid . |
| 5,617,029 | 4/1997 | Schneider . |

OTHER PUBLICATIONS

Magnetic Resonance Imaging, M.R. Willcott, III, G.L. Mee, and J.P. Chesick, Magnetic Field Mapping in NMR Imaging, vol. 5, pp. 301–306, 1987.

Magnetic Resonance in Medicine, I.S. Mackenzie, E.M. Robinson, A.M. Wells and B. Wood, A Simple Field Map for Shimming, vol. 5, pp. 262–268, 1987.

Journal of Magnetic Resonance, D.I. Hoult, "Shimming" on Spatially Localized Signals, vol. 73, pp. 174–177, 1987.

(List continued on next page.)

Primary Examiner—Christine K. Oda
Assistant Examiner—Brij Shrivastav
Attorney, Agent, or Firm—Fay, Sharpe, Fagan, Minnich & McKee, LLP

[57] ABSTRACT

A method for shimming main magnetic field in a magnetic resonance imaging apparatus is provided. The method includes generating a radio frequency pulse sequence (200) while a subject is in an examination region (14) of the magnetic resonance imaging apparatus. A reference signal (EC1) which is immune to shim errors is then acquired. Thereafter, a field echo (EC3a) signal is acquired which is sensitive to shim errors. The field echo (EC3a) signal is acquired at a timed interval (T) equal to a multiple of an amount of time it takes for fat and water signals to become in phase. The temporal position of the maximum of the field echo signal is compared to its predicted temporal position (EC3) relative to the reference signal (EC1). The shim term is calculated based on the preceding comparison and an electrical current is applied to one of a gradient offset and a shim coil such that the main magnetic field is adjusted according to the shim term.

20 Claims, 3 Drawing Sheets

OTHER PUBLICATIONS

Magnetic Resonance in Medicine, David M. Doddrell, Graham J. Galloway, Ian M. Brereton and William M. Brooks, Noodal Inhomogeneity Mapping By Localized Excitation—The "Nimble" Shimming Technique for High–Resolution in vivo NMR Spectroscopy, vol. 7, pp. 352–357, 1988.

Journal of Magnetic Resonance, Manfred G. Prammer, John C. Haselgrove, Meir Shinnar and John S. Leigh, A New Approach to Automatic Shimming, vol. 77, pp. 40–52, 1988.

Journal of Magnetic Resonance, James Tropp, Kevin Derby and Christine Hawryszko, Automated Shimming of $B_o$ For Spectroscopic Imaging, vol. 85, pp. 244–254, 1989.

Concept in Magnetic Resonance, Gwendolyn Chmurny and David Hoult, The Ancient and Honourable Art of Shimming, vol. 2, pp. 131–149, 1990.

Magnetic Resonance in Medicine, Erika Schneider and Gary Glover, Rapid in vivo Proton Shimming, vol. 18, pp. 335–347, 1991.

Magnetic Resonance in Medicine, Peter Webb, Albert Macovski, Rapid, Fully Automatic, Arbitrary–volume in vivo Shimming, vol. 20, pp. 113–122, 1991.

Phys. Med. Biol., Jonathan Sharp, Martin Leach and David Collins, A Single–Shot Shimming Sequence Using Low–Power RF Noise Pulse for Localized in vivo NMR spectroscopy, vol. 37, pp. 281–287.

Journal of Magnetic Resonance, Rolf Gruetter and Chris Boesch, Fast, Noniterative Shimming of Spatially Localized Signals, in vivo Analysis of the Magnetic Field Along Axes, vol. 96, pp. 323–334, 1992.

Journal of Medicine Resonance, Fumiyuki Mitsumori, Spatially Localized Shimming Using Noise Pulses, Series A, vol. 102, pp. 228–230, 1993.

MRM, Rolf Gruetter, Automatic, Localized in vivo Adjustment of all First–and Second–Order Shim Coils, vol. 29, pp. 804–811, 1993.

Journal of Magnetic Resonance, P.C.M. Van Zijl, S. Sukumar, M. O'Neill, P. Webb and R.E. Hurd, Optimized Shimming for High–Resolution NMR Using Three–Dimensional Image–Based Field Mapping, Series A, vol. 111, pp. 203–207, 1994.

MRM, Ngong M. Yongbi, Geoffrey S. Payne, Martin O. Leach, A Gradient Scheme Suitable for Localizing Shimming and in vivo $^1H/^{31}P$ Steam and Isis NMR Spectroscopy, vol. 32, pp. 768–772, 1994.

MRM, Anders Ericsson, Jan Weis, Anders Hemmingsson, Mats Wikström, Göran O. Sperber, Measurements of Magnetic Field Variations in the Human Brain Using a 3D–FT Multiple Gradient Echo Technique, vol. 33, pp. 171–177. 1995.

MRM, Han Wen, Farouc A. Jaffer, An in vivo Automated Shimming Method Taking into Account Shim Current Constraints, vol. 34, pp. 898–904, 1995.

Journal of Magnetic Resonance, J. Hu, T. Javaid, F. Arias–Mendoza, Z. Liu, R. McNamara and T. R. Brown, a Fast, Reliable, Automatic Shimming Procedure Using $^1H$ Chemical–Shift–Imaging Spectroscopy, Series B, vol. 108, pp. 213–219, 1995.

JMRI, Timothy G. Reese PhD., Timothy L. Davis MS, Robert M. Weisskoff PhD, Automated Shimming at 1.5T Using Echo–Planar Image Frequency Maps, vol. 5, pp. 739–745, 1995.

MRM, Shoichi Kanayama, Shigehide Kuhara and Kozo Satoh, in vivo Rapid Magnetic Field Measurement and Shimming Using Single Scan Differential Phase Mapping, vol. 36, pp. 637–642, 1996.

MRM, Andrew M. Blamire, Douglas L. Rothman and Terry Nixon, Dynamic Shim Updating: A New Approach Towards Optimized Whole Brain Shimming, vol. 36, pp. 159–165, 1996.

MRM, Farouc A. Jaffer, Han Wen, Robert S. Balaban and Steven D. Wolff, A Method to Improve the $B_0$ Homogeneity of the Heart in vivo, vol. 36, pp. 375–383, 1996.

MRM, Glen Morrell and Daniel Spielman, Dynamic Shimming for Multi–Slice Magnetic Resonance Imaging, vol. 38, pp. 477–483, 1997.

Med. Phys., D. Holz, D. Jensen, R. Proksa, M. Tochtrop and W. Vollmann, Automatic Shimming for Localized Spectroscopy; vol., pp. 898–903, 1988.

Woodrow W. Conover, NMC, Magnet Shimming,.

P. Margosian, et al., "Rapid Measurement of Magnetic Field Inhomogeneities Using Imaging Techniques," SMRM/ISMRM Conf. Abstracts, 1984, p. 495.

M. Tochtrop, et al., "Automatic Shimming of Selected Volumes in Patents," SMRM/ISMRM Conf. Abstracts, 1987, p. 816.

John C. Haselgrove, et al, "Field Mapping for Shimming Using a Surface Coil," SMRM/ISMRM Conf. Abstracts, 1988, p. 133.

Peter Webb, et al., "Rapid, Fully Automated Arbitrary Volume, in vivo Shimming," SMRM/ISMRM Conf. Abstracts, 1990, p. 541.

R. Gruetter, et al., "A Practical Approach to Automatic Shimming of Spatially Localized Signals," SMRM/ISMRM Conf. Abstracts, 1990, p. 542.

William R. Riddle, et al., "Using the Phase of the Quadrature Signal in Magnetic Resonance Spectroscopy to Evaluate Magnetic Field Homogeneity and Temporal Stability," SMRM/ISMRM Conf. Abstracts, 1991, p. 453.

R. Gruetter, et al., "Can the Contribution of the Static Field to the Linewidth be Removed in vivo by Shimming?," SMRM/ISMRM Conf. Abstracts, 1991, p. 468.

N.M. Yongbi, et al., "A Steam Localisation Shimming Sequence Suitable for in vivo $^1H/^{31}P$ ISIS NMR Spectroscopy," SMRM/ISMRM Conf. Abstracts, 1992, p. 3741.

J.Hu, et al., "Integration of Automatic Shimming with Clinical Spectroscopy," SMRM/ISMRM Conf. Abstracts, 1992, p. 3825.

Y. Onodera, et al., "A Phase Mapping Method for Rapid in vivo Shimming," SMRM/ISMRM Conf. Abstracts, 1992, p. 3919.

T. G. Reese, et al., "Automated Shimming at 1.5T Using Echo–Planar Image Frequency Maps," SMRM/ISMRM Conf. Abstracts, 1994, p. 354.

A. Elevelt, et al., "Technical and clinical evaluation of SPIR and an automatic linear shim technique at 0.5 T," SMRM/ISMRM Conf. Abstracts, 1993, p. 1199.

Jie F. Shen, et al., "A Simple Automatic Shimming Technique for Flash Imaging with Long Echo Time," SMRM/ISMRM Conf. Abstracts, 1993, p. 1242.

A. Jesmanowicz, et al., "Real–Time Shimming Using a Tagging Grid at 3 Tesia," SMRM/ISMRM Conf. Abstracts, 1994, p. 477.

J.C. Sharp, et al., "Sub–Voxel Field–Mapping for Fully Automated Localized Shimming," SMRM/ISMRM Conf. Abstracts, 1994, p. 763.

F. Hennel, et al., "Interference Artefact: A Method For Magnetic Field Mapping," SMRM/ISMRM Conf. Abstracts, 1994, p. 764.

A. Manabe, "Multi–Angle Projection Shim (MAPshim): in vivo Shim Adjustment up to 2nd Order with 0.2 Second Sequence Time," SMRM/ISMRM Conf. Abstracts, 1994, p. 765.

M.A. Bernstein, et al., "Phased–Contrast Phased–Array Reconstruction, with Application to Autoshim," SMRM/ISMRM Conf. Abstracts, 1994, p. 833.

Han Wen, et al., "A Non–Iterative 3D Automated Shimming Routine for in vivo Studies," SMRM/ISMRM Conf. Abstracts, 1994, p. 1081.

Z. Liu, et al., "CSI—Autoshim Procedures for Body and Surface Coil," SMRM/ISMRM Conf. Abstracts, 1994, p. 1174.

Y. Ng, et al., "Automatic Shimming Using Distortion Corrected Echo Planar Field Maps," SMRM/ISMRM Conf. Abstracts, 1995, p. 616.

Gerard T. Luk Pat, et al., "Inhomogeneity Correction for Echo–Planar Imaging with a Polynomial Estimate of the filed Map," SMRM/ISMRM Conf. Abstracts, 1995, p. 617.

A. Jesmanowicz, et al., "Real–Time Two–Shot EPI Auto Shim Overall Shimming Polynomials," SMRM/ISMRM Conf. Abstracts, 1995, p. 618.

Daniel Spielman, "Dynamic Shimming for Multislice Spectroscopy and Imaging," SMRM/ISMRM Conf. Abstracts, 1995, p. 652.

A. Manabe, "Multi–Angle Projection Shim (MAPshim) for localized volumes," SMRM/ISMRM Conf. Abstracts, 1995, p. 696.

Y. Cao, et al., "Automated Shimming on a 3.0T Whole body Scanner Using Three Dimensional Field Mapping," SMRM/ISMRM Conf. Abstracts, 1995, p. 697.

R. Gruetter, et al., "A Fast, Automatic Shimming Technique by Mapping Along Projections (Fastmap) at 4 Tesia," SMRM/ISMRM Conf. Abstracts, 1995, p. 698.

A.M. Blamire, et al., "Dynamic Shim Updating—A Novel Approach to Optimized Whole Brain Shimming," SMRM/ISMRM Conf. Abstracts, 1995, p. 802.

Farouc A. Jaffer, et al., "3D CSI Shimming of the Human Heart at High Field Strengths," SMRM/ISMRM Conf. Abstracts, 1995, p. 1413.

Y. Cao, et al, "Stimultaneous Unwrapping of Phase Difference Images and Segmentation of the Scalp for Automated Shimming at 3T," SMRM/ISMRM Conf. Abstracts, 1996, p. 41.

O.H. Heid, "Noniterative Localized in vivo Shimming in <15s," SMRM/ISMRM Conf. Abstracts, 1996, p. 363.

Z. Liu, et al, "Automatic Shimming Procedure for Body and Surface Coils, using Chemical Shift Imaging," SMRM/ISMRM Conf. Abstracts, 1996, p. 1218.

G. Morrell, et al., "Implementation of Dynamic Shimming for Multi–Slice Imaging," SMRM/ISMRM Conf. Abstracts, 1997, p. 287.

Jun Shen, et al, "Improvements on a Localized, Automatic Shimming Method (Fastmap)," SMRM/ISMRM Conf. Abstracts, 1997, p. 1367.

Daniel Speilman, et al., "Quantitative Analysis of Improved Homogeneity Using Linear Versus Higher Order Shims for CSI of the Brain," SMRM/ISMRM Conf. Abstracts, 1997, p. 1452.

A. Jesmanowicz, et al., "Single–Pass Automatic 3D Shimming," SMRM/ISMRM Conf. Abstracts, 1997, p. 1983.

TWO-PEAK ALIGNMENT METHOD OF FIELD SHIMMING

BACKGROUND OF THE INVENTION

The present invention relates to the magnetic resonance arts. It finds particular application in conjunction with medical diagnostic magnetic resonance imaging and will be described with particular reference thereto. However, it is to be appreciated that the present invention also finds application in magnetic resonance spectroscopy, magnetic resonance imaging for other applications, and generally those applications where homogeneous magnetic fields are desirable.

Generally, nuclear magnetic resonance (NMR) and magnetic resonance imaging (MRI) techniques employ a spatially uniform and temporally constant main magnetic field, $B_0$, generated through an examination region. Superimposed on the $B_0$ magnetic field is a $B_1$ radio frequency (RF) magnetic field at the NMR resonant frequency. For MRI applications, there is also a set of gradient magnetic fields used to spatially encode resonant spins. Some MRI techniques are highly sensitive to magnetic field homogeneity. However, the geometric shape and/or magnetic susceptibility of a subject being scanned, built-in main magnet tolerances, environmental and/or site effects, and the like contribute to the main magnetic field's inhomogeneity and/or non-uniformity. In turn, this leads to imaging problems.

Methods for controlling the homogeneity of the main magnetic field include both passive and active shimming techniques. The passive technique is typified by arranging shim steel to minimize static magnetic field inhomogeneities based upon NMR field plot measurements. The NMR field plot measurements are performed without a subject in the examination region. Generally, the shim steel technique is not adjustable on a scan-by-scan basis. It is mainly used to shim out the effects of built-in magnet tolerances and environmental or site effects. This technique is not suited to handle inhomogeneities within the main magnetic caused by subject geometry and/or susceptibility.

Active shimming generally employs multiple orthogonal shim coils and/or gradient coil offsets. An electrical current is applied to the shim coils and/or gradient coil offsets in order to cancel inhomogeneities in the main magnetic field. In some cases, initial optimal shim currents are applied to the shim coils to initially establish uniform magnetic fields using the same type of NMR field plot measurements described above with reference to the passive technique. Commonly first order and occasionally second or third order corrections are implemented to compensate for non-uniformities in the main magnetic field. Furthermore, the shimming can be adjusted from scan-to-scan and/or subject-to-subject to adjust for inhomogeneities caused by the susceptibility and/or geometric shape of a subject being imaged. In general, there are a number of methods and/or techniques of active shimming aimed at homogenizing the main magnetic field in an MRI system. These techniques and methods can broadly be grouped as follows: signal maximization methods, phase-fitting algorithms, field mapping techniques, peak location/time methods, chemical shift imaging methods, measurement of distortion of known objects, and various qualitative methods to view field homogeneity which do not compute shim term corrections.

In one particular prior art reference, U.S. Pat. No. 5,359,289 to van der Meulen, a peak location/time method is proposed. The method measures the time location of the peak of the magnetic resonance signal (in one example, a gradient echo and in another, a spin echo) and compares the measured time location of the peak against a theoretically predicted time location to produce a linear shim term correction. However, various subtle timing delays may exist in the gradient and/or other system components which are independent of the sampling system. It is assumed that such delays or errors are negligibly small. This may not necessarily be the case, and when such errors are not negligibly small, the shim technique based strictly on timing measurements results in inaccurate shimming.

In another particular reference, U.S. Pat. No. 5,391,990 to Schmitt, et al., shimming is accomplished via the use of an echo planar sequence having a sinusoidal readout with the phase encode lobes disabled. The algorithm observes the even versus odd echo timing throughout a number of echoes of data acquisition and determines a best fit shim value which aligns the echoes. However, a high band width is required to sample the data, and the accuracy of the peak positioning algorithm may be compromised by the presence of noise. Additionally, with such data, the echo positions do not necessarily progress in a linear fashion or higher order drift, but rather may tend to wobble temporally. The gradient amplifier duty cycle, and the like may induce this temporal wobble in the signal. Furthermore, the reference fails to account for miscellaneous timing delays between various gradient axes which can also cause the peaks to not co-register correctly in oblique scans.

The present invention contemplates a new and improved shim algorithm for use in the magnetic resonance applications which overcomes the above reference problems and others.

SUMMARY OF THE INVENTION

In accordance with an aspect of the present invention, a method of shimming a main magnetic field in a magnetic resonance imaging apparatus is provided. The method includes generating a radio frequency pulse sequence while a subject is in an examination region of the magnetic resonance imaging apparatus. A reference signal which is immune to shim error is then acquired. Thereafter, a field echo signal is acquired which is sensitive to shim errors at a time interval equal to a multiple of an amount of time it takes for fat and water signals to become in phase. The temporal position of a maximum of the field echo signal is compared to its predicted temporal position relative to the reference signal. Based on the previous comparison, a shim term is calculated. Finally, an electrical current is applied to one of a gradient offset and a shim coil such that the main magnetic field is adjusted according to the shim term.

In accordance with a more limited aspect of the present invention, the step of generating includes generating at least first, second, and third radio frequency pulses, the first radio frequency pulse being a 90 degree pulse.

In accordance with a more limited aspect of the present invention, the second and third radio frequency pulses are 90 degree pulses.

In accordance with a more limited aspect of the present invention, the second and third radio frequency pulses are 180 degree pulses.

In accordance with a more limited aspect of the present invention, the resulting reference signal and the resulting field echo signal are read out with gradient polarities that are the same.

In accordance with a more limited aspect of the present invention, the reference signal and the field echo signal are produced from a common excitation signal.

In accordance with a more limited aspect of the present invention, steps of the method are repeated a number of times until the main magnetic field is within a predetermined tolerance.

In accordance with a more limited aspect of the present invention, the reference signal is one of a stimulated echo and a spin echo.

In accordance with a more limited aspect of the present invention, steps of the method are repeated a plurality of times for at least three mutually orthogonal axes.

In accordance with a more limited aspect of the present invention, steps of the method are repeated for an axis until the magnetic field along that axis is within a predetermined tolerance before moving on to another axis.

In accordance with a more limited aspect of the present invention, steps of the method are performed once for each axes in turn and then repeated for each axes in turn until the magnetic field is within a predetermined tolerance.

In accordance with a more limited aspect of the present invention, the shim term is a linear shim term.

In accordance with another aspect of the present invention, a method of compensating for distortions in the temporally constant magnetic field generated in a magnetic resonance method is provided. The magnetic resonance method includes generating a temporally constant magnetic field in an examination region, placing a subject in the temporally constant magnetic field thereby distorting it, exciting and manipulating resonance of dipoles in the subject with radio frequency pulses, encoding the excited resonance with magnetic field gradients, and reading out and processing the excited, manipulated, and encoded resonance.

The method of compensating for distortions in the temporally constant magnetic field includes applying a series of radio frequency pulses which excite resonance in a selected plane which is subject to the distortions. The resonance is then de-sensitized to the distortions in the selected plane. The resonance is next re-sensitized to the distortions in the selected plane. A first magnetic resonance echo is induced that is insensitive to the distortions in the selected plane. Thereafter, a second magnetic resonance echo is induced which is sensitive to the distortions in the selected plane. It is induced at a projected time interval after the first echo. The actual time interval between the first and second echoes is then measured. The temporally constant magnetic field is adjusted along the selected plane in accordance with a difference between the actual and projected time intervals.

In accordance with a more limited aspect of the present invention, the method is repeated until the distortions fall within a predetermined tolerance. For a number of first repetitions, the projected time interval is less than a time it takes fat and water signals to become in-phase. For at least one fine tuning repetition, the projected time interval is the same as the time it takes for fat and water signals to become in-phase.

In accordance with another aspect of the present invention, a magnetic shimming system that compensates for the distortions to the main magnetic field in a magnetic resonance imaging apparatus is provided. The magnetic resonance imaging apparatus includes a couch which supports a subject being examined within an examination region, a main magnet that generates through the examination region a temporally constant main magnetic field having distortions, a magnetic field gradient generator having gradient coils and connected gradient amplifiers which supply electrical current pulses to the gradient coils to create substantially linear magnetic gradients in the main magnetic field, a radio frequency transmission system having an RF coil and connected transmitter for generating a radio frequency pulse sequence which excites magnetic resonance in magnetic dipoles of the subject, a radio frequency reception system having an RF coil and connected receiver for receiving magnetic resonance signals from excited magnetic dipoles as they relax, and a signal processor for processing received magnetic resonance signals into a human readable form. The magnetic shimming system includes a sequence control circuit which manipulates the magnetic gradient generator, to induce a shimming series of gradient lobes along a read out axis, and the radio frequency transmission system, to induce a shimming series of radio frequency pulses, such that a shimming magnetic resonance signal is produced by excited magnetic dipoles as they relax. The shimming magnetic resonance signal received by the reception system has a plurality of echos including at least a first echo immune to the distortions to the main magnetic field, and a second echo sensitized to the distortions to the main magnetic field. The second echo is received at a time interval after the first echo equal to a multiple of an amount of time it takes for fat and water signals to become in-phase. A shim term generator calculates a shim term based on a temporal position of a maximum of the second echo as compared to its predicted temporal position relative to a temporal position of a maximum of the first echo. A shimming mechanism carries an electrical current such that the distortions to the main magnetic field are compensated for according to the shim term.

In accordance with a more limited aspect of the present invention, the shimming series of radio frequency pulses includes at least first, second, and third radio frequency pulses. The first radio frequency pulse has a 90 degree flip angle.

In accordance with a more limited aspect of the present invention, the second and third radio frequency pulses both have one of a 90 degree flip angle and a 180 degree flip angle.

In accordance with a more limited aspect of the present invention, the first and second echos are received by the reception system under gradient lobes having the same polarity.

In accordance with a more limited aspect of the present invention, the first echo is one of a stimulated echo and a spin echo, and the second echo is a field echo.

In accordance with a more limited aspect of the present invention, the shim term is a linear shim term.

One advantage of the present invention resides in its ability to quickly and robustly shim the main magnetic field of a magnetic resonance imaging system.

Another advantage of the present invention is that it accounts for imperfect timing relationships between various subsystem hardware components and reduces shim errors resulting therefrom.

Another advantage of the present invention is that it employs a limited number of high signal-to-noise ratio signals.

Another advantage of the present invention is that the high quality reference signal and sensitized signals used reduce any fat/water phase modulation which may introduce shim errors.

Another advantage of the present invention is that like polarity gradients are employed to read out the collected signals thereby reducing further unknown timing errors which may be introduced as a result of different gradient lobes not behaving identically.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
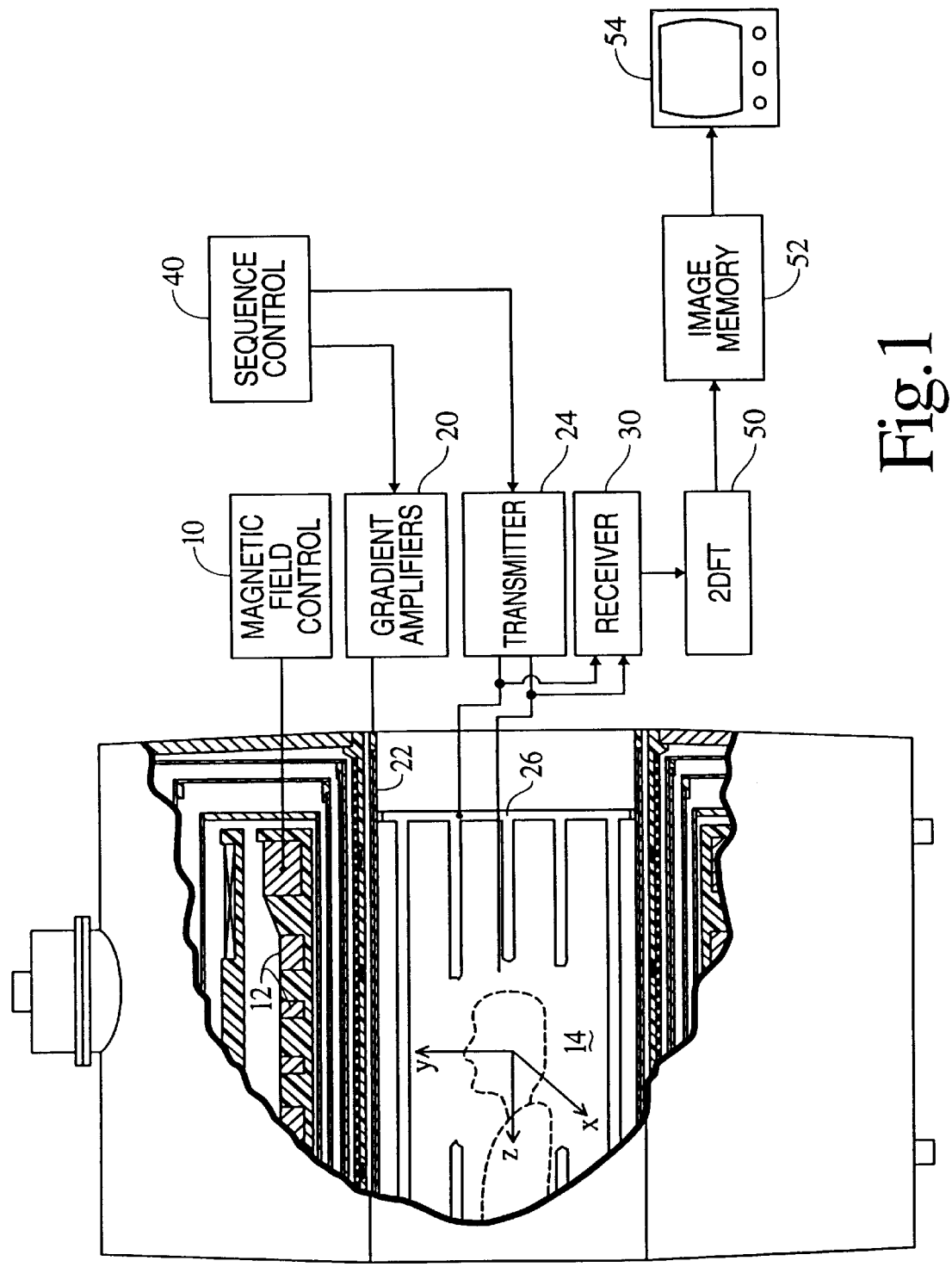
FIG. 1 is a diagrammatic illustration of a magnetic resonance imaging apparatus in accordance with the present invention.

With reference to FIG. 1, a main magnetic field control 10 controls for conducting or resistive magnets 12 such that a substantially uniform, temporally constant main magnetic field is created along a z axis through an examination region 14. A couch (not illustrated) suspends a subject to be examined within the examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of gradient coil assemblies 22 to create magnetic field gradients along x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration, which taken together with each other and any applied gradients, achieve a selected magnetic resonance manipulation. For whole-body applications, the resonance signals are commonly picked up by the whole-body RF coil 26.

For generating images of local regions of the subject, specialized radio frequency coils are placed contiguous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by the whole-body RF coil 26. In any event, the resultant radio frequencies signals are picked up by the whole-body RF coil 26, the insertable RF coil, or other specialized RF coil and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals are received, demodulated, and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a human readable display of the resultant image.

While the invention herein is described with reference to the MRI apparatus detailed above, it is appreciated that the invention is applicable to other MRI apparatus. For example, the invention is equally amenable to open geometry magnets wherein opposing pole pieces, joined by a ferrous flux return path, define an examination region therebetween.

Ideally the main magnetic field is uniform throughout an imaging volume. However, in practical application, non-uniformities and/or inhomogeneities are present in the main magnetic field which are deleterious to the reconstructed images. Generally, passive shimming techniques employing shim steel, shim trays, and the like are employed to correct those inhomogeneities and/or non-uniformities resulting from built-in magnet tolerances and environmental or site effects. However, such passive shimming techniques are not suited to correcting magnetic field inhomogeneities such as those resulting from the geometric shape and/or magnetic susceptibility of a subject placed in the examination region 14. This being the case, the following active shimming technique is provided for the correction of such magnetic field inhomogeneities. It is to be appreciated, however, that the following is also applicable to those inhomogeneities and/or non-uniformities created by built-in magnet tolerances and/or environmental effects as well.

Figure 2:
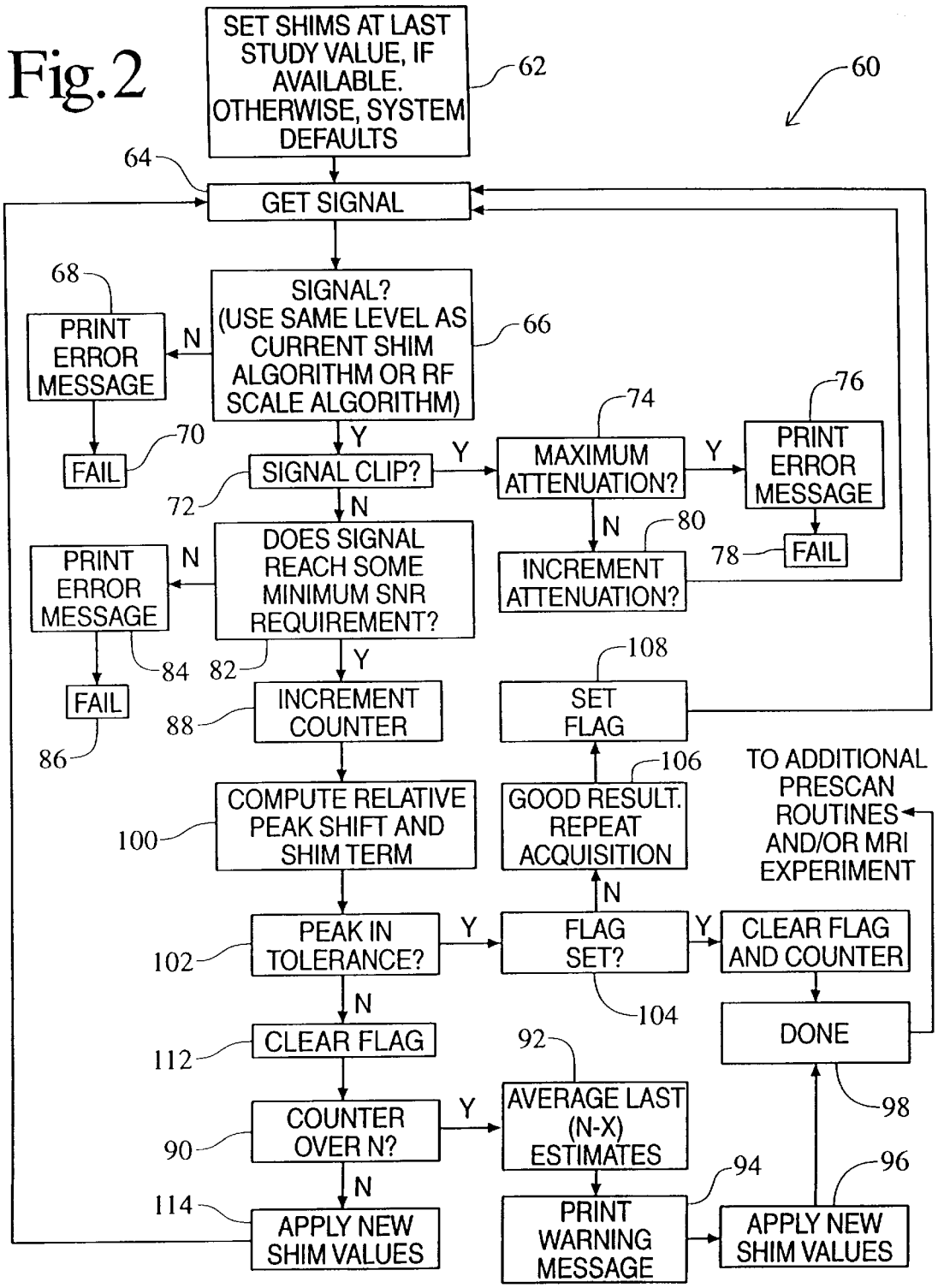
FIG. 2 is a flow chart illustrating a magnetic shimming sequence in accordance with the present invention; and, FIG. 3 is an illustration of a pulse sequence for generating and acquiring magnetic resonance signals used to calculate shim terms for a magnetic shimming sequence in accordance with the present invention.

With reference to FIG. 2, prior to running the MRI experiment or imaging scan, the illustrated shimming sequence 60 is run by the sequence control 40 as part of the MRI apparatus initialization procedure while the subject is present in the examination region 14. The main magnetic field may be shimmed to correct for inhomogeneities by applying DC gradient offsets to the gradient coils 22 via gradient amplifiers 20 or alternately by applying electrical current to dedicated shim coils (not illustrated) analogous to the gradient coils 22.

The shim sequence 60 starts by setting the shim terms to the last available value computed or to some other predetermined system default 62. Next, a signal (detailed later herein) is generated 64. A query 66 is then made to ensure that a suitable signal has been received. If no signal has been received, an error message is printed 68 and the sequence terminated 70. If a signal has indeed been received, it is next checked to ensure that the signal has not been clipped 72. If the signal has been clipped and a maximum attenuation 74 for the system has been achieved, an error message is generated 76 and the sequence terminated 78. However, if the system has not achieved a maximum attenuation 74, the attenuation is incremented 80 and the signal regenerated 64. After the signal has been checked for clipping, a signal-to-noise ratio inquiry 82 is initiated. If the signal-to-noise ratio does not reach a predetermined minimum, an error message is generated 84 and the sequence is terminated 86. If the predetermined signal-to-noise ratio requirement is achieved, the shimming sequence continues.

At this time, a counter is incremented 88. The counter ensures that the shimming sequence 60 will not continue indefinitely if the desired tolerance is not met. That is to say, if the counter exceeds a predefined number n 90 indicating an excess of repetitions, then the shim term is estimated by taking an average 92 of a number (n-x) of the preceding repetitions. When this estimating procedure is employed, a printed warning is displayed 94 to indicate that the desired tolerance has not been achieved, and the new shim values being applied are estimated. The estimated values are then indeed applied 96, and the sequence is completed 98.

Following the incrementing of the counter 88, a temporal shift of a peak of the measured signal relative to its predicted location is determined and the accompanying shim term is computed 100. Next, it is determined whether or not the peak falls within a predetermined tolerance 102. If it does and the flag has not been set 104, then the result is deemed suitable 106 and the acquisition 64 is repeated after setting the flag 108. The flag query 104 is employed to ensure that two consecutive repetitions result in suitable in tolerance shimming prior to completing 98 the overall shim sequence 60. After the flag has been set 108, indicating an in tolerance result 106, on the second consecutive acquisition 64, if the peak is again in tolerance, the flag query 104 is positive so that the flag and counter are reset 110 for future sequence runs and the sequence 60 is completed 98. If the peak does not fall within the predetermined tolerance, the flag is cleared 112 and the state of the counter is queried 90. If the counter has not exceeded the predetermined number n of repetitions, then the new shim values are applied 114 and the signal reacquired 64. However, as stated earlier, if the counter has exceeded the acceptable number n of repetitions, the estimating procedure 92–98 is utilized.

In one preferred embodiment of the present invention, the shimming sequence is applied along the three mutually orthogonal axes x, y, and z. In one embodiment, the shimming sequence 60 is applied iteratively along each successive axis until that axis is within tolerance before moving to the next axis. In an alternative embodiment, each iteration cycle applies the shimming sequence 60 to each axis in turn. For example, the shimming sequence could be applied along the x axis, then along the y axis, and then along the z axis for the first iteration and then reapplied to the x, y, and z axes each in turn for the second iteration, etc., until the magnetic field along each axis is within tolerance as a whole. With this latter approach, the main magnetic field is shimmed in such a manner that coupling between shim terms is accounted for. That is to say, changes to shim terms on other axes that result from changes to the shim term on a given axis are compensated for by successively applying the shim sequence 60 to each axis per iteration cycle. Furthermore, it is to be appreciated that while the three primary orthogonal projections is a minimum number of projects desired to shim the main magnetic field, the active shimming technique employed herein is not limited to these three projections. In fact, any number of projections as may be desirable for a given application may be employed.

Figure 3:
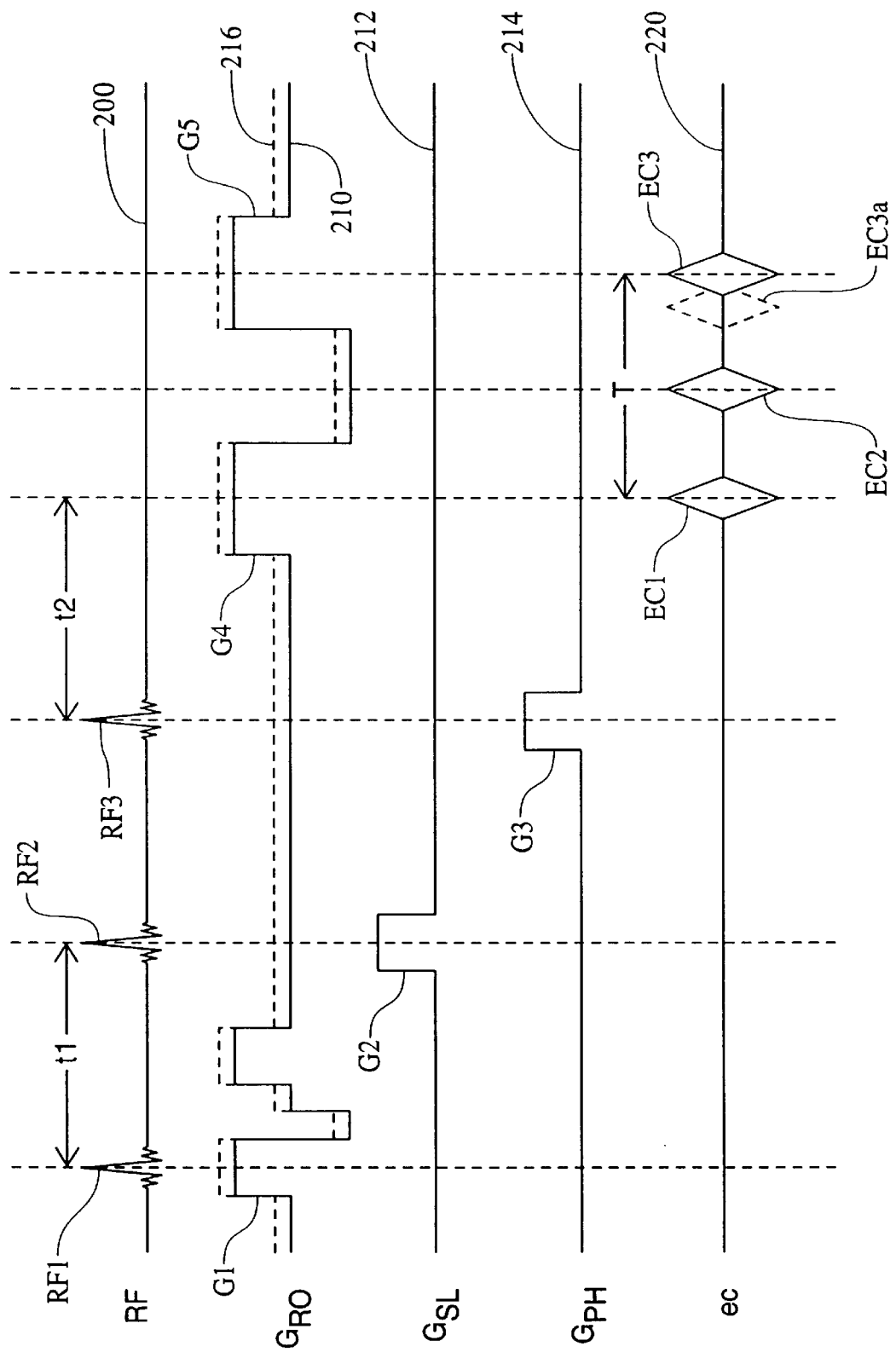

With reference to FIG. 3, the pulse sequences illustrated depict the manner in which the signals are generated and acquired or collected. The radio frequency pulse sequence 200 is transmitted into the examination region via radio frequency coil 26 and transmitter 24. In a preferred embodiment, the RF pulse sequence 200 includes three consecutive RF pulses having 90 degree flip angles: RF1, RF2 and RF3, respectively. Alternately, radio frequency pulses RF2 and RF3 have 180 degree flip angles. The gradient pulse sequence 210 having a number of gradient lobes is applied to the gradient coil assembly 22 by the gradient amplifiers 20 in the readout direction along the axis being shimmed. Gradient pulse sequences 212 and 214 serve slice selection and phase encoding functions, respectively. Volume localization is achieved by applying the RF pulses with each of the gradient axes used in turn. For the illustrated sequence, RF pulses, RF1–RP3 are applied under gradient lobes G1–G3, respectively. When the axial component of the main magnetic field $B_0$ is substantially uniform along the axis being shimmed, the echo sequence or signal 220 is received by the receiver 30 via the radio frequency coil 26. The signal 220 includes three echoes: EC1, EC2, and EC3, respectively. EC1, readout under gradient lobe G4, is a reference signal which is immune to shim errors. On the other hand, EC3, readout under gradient lobe G5, represents a field echo which is sensitive to shim errors. More specifically, EC1 occurs at a time interval t2 following the last radio frequency pulse RF3. Furthermore, time interval t2 is equal to the time interval t1 existing between the first and second RF pulses, RP1 and RF2, respectively. The 90 degree radio frequency pulses RF2 and RF3 act in concert as if a 180 degree refocusing pulse. Therefore, the stimulated echo EC1 is generated at a time such that the pair of 90 degree radio frequency pulses RF2 and RF3 are centrally located between RF1 and EC1. That is to say that before the refocusing sequence RF2, RF3, the dipole moments are dephased for a given amount of time and after the refocusing sequence RF2, RF3 flips the dipole moments, they are rephased in the same length of time. This is illustrated by the fact that the gradient area to the left and right of the refocusing sequence RF2, RF3 between RF1 and EC1 is the same. Next, consider a constant field inhomogeneity in the direction of the readout axis or along the shimming direction. This condition can be depicted as a gradient offset 216 illustrated by the dashed line. However, the gradient areas under the dashed line 216 to the left and right of the refocusing sequence RP2, RP3 between RF1 and EC1 remains equal. Hence, the reference signal EC1 is immune from at least linear shim errors.

Turning now to the field echo signal EC3, this echo is sensitive to shim errors. The field echo signal EC3 is employed rather than EC2 so that the field echo signal is read out under the same polarity gradient lobe as the reference signal EC1. In this manner, possible differences between positive and negative gradient lobes are discounted. Furthermore, the sensitized signal EC3 is collected at the fat/water in-phase time interval T. That is, the time T is equal to a multiple of the amount of time it takes for fat and water signals to become in phase and is a function of the magnetic field strength. By collecting the data at this specified interval, the constructive and destructive interference of the fat and water components present in the signal which cause a modulation of the signal's amplitude and can introduce errors into the shim correction values is avoided. In a main magnetic field $B_0$ having a substantially uniform axial component along the shim direction, the field echo EC3 appears at a time relative to the reference signal EC1 such that the time integral becomes zero over the entire effective gradient therebetween. That is to say that the amount of dephasing and rephasing is equal after the reference signal EC1. However, a linear field inhomogeneity depicted by the gradient offset illustrated by the dash line 216 causes the peak of the field echo EC3 to be shifted to a position EC3$a$ relatively closer to the reference signal EC1. The peak shift results in order to keep the time integral over the entire effective gradient between the sensitized field echo and the reference signal EC1 equal to zero. That is to say, the peak occurs at the position from the reference signal EC1 where an equal amount of dephasing and rephasing has occurred. In this manner, the amount of shift of the sensitized field echo EC3a represents the measure of the linear field inhomogeneity in the direction of the readout gradient or along the shimmed axis. Furthermore, by measuring the time interval relative to the reference signal EC1, any inherent or subtle timing delays in the gradient or other system components which are independent of the sampling system are accounted for. Therefore, knowing the shift, a DC gradient offset may be applied to the gradient coils 26 via gradient amplifier 20 to shift the peak back to its initial location. Alternately, an electrical current may be applied to dedicated shim coils which are analogous to the gradient coils 22.

At relatively lower field strengths, the time interval T becomes relatively larger and the shimming sequence becomes more sensitive to smaller errors. In an extreme case, if the shim error is large, the sensitivity can reach a point where the received signal is nearly lost. Hence, for particular applications and/or under certain circumstances, the sensitized echo may be collected at a time interval shorter than the fat/water in-phase time interval. For example, the first few iterations of the shimming sequence may be performed while collecting the sensitized echo at a time interval other than the fat/water in-phase in time interval T. As the number of iterations increases and the correct shim term is zeroed in on, the last couple iterations or, alternatively, the final iteration, conducted for fine tuning will collect the sensitized echo at the fat/water in-phase time interval T.

Generally, the sequence is designed such that the two data acquisitions are produced from a common excitation signal. This helps reduce sensitivity to motion because the faster the signal is collected, the less chance there is that motion will corrupt the data. Additionally, the data is collected as quickly as possible, with the minimum of gradient area and gradient activity so that: there is little time for motion between data collections, the amount of signal dephasing due to motion in the presence of a gradient is reduced, and induced eddy currents are kept to a minimum. Furthermore, as described earlier herein, the shimming sequence is iterative to account for possible system nonlinearities and provide a mechanism to catch potential shim errors due to patient motion.

While the shim sequence herein has been described with reference to linear shim terms, it is appreciated that the method may be adapted to compute higher order shim terms as well. Furthermore, a correlation of peaks may also provide goodness of fit information which describes how well the method computes the linear shim terms. Additionally, it should be noted that the method is applicable to both automatic and/or manual operation.

While the method has been illustrated employing a simulated echo as the reference signal, a spin echo or other echo immune or nearly immune from shim errors may be employed as the reference signal. For some applications, it may be advantageous to collect the data in two separate acquisitions where the second data acquisition is identical to the first but with appropriate time shifts in the data window so that appropriate sensitization is achieved. The excited volume can be slab or volume based. Optionally, the positions of the radio frequency pulses can be adjusted to compensate for amplitude signal losses due to changes in data window time position. However, changing the radio frequency pulse may preserve or change subtle system behaviors (for example, eddy currents) and as such might introduce or remove certain shim errors.

The technique may also employ various combinations of gradient polarity on any of the three axes to account for and/or quantitate various subtle system performance characteristics such as gradient nonlinearities and eddy currents. The technique could also apply spectral analysis to determine the frequencies of the various spectral components (i.e., water and fat) and incorporate that information during the shimming process to ensure that changes in frequency in the volume or slab of interest do not cause the position of the volume or slab to move.

Often the impact of improperly set shims during the shimming process is a loss in the sensitized signal. Therefore, as an independent measure of success, the shimming process optionally maximizes the sensitized signal. Furthermore, while the sequence diagram suggests the use of three identical radio frequency pulses set to a 90 degree tip angle, the sequence is not limited to that sequence of pulses or those tip angles. Any sequence that would generate a reference signal immune from shim errors and a shim sensitized field echo is sufficient. Optionally, the shimming sequence is combined with preset or magnetization preparation pulses for a range of applications, such as fat suppression and the like.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of shimming a main magnetic field in a magnetic resonance imaging apparatus comprising:
   (a) generating a radio frequency pulse sequence while a subject is in an examination region of the magnetic resonance imaging apparatus;
   (b) acquiring a reference signal which is immune to shim errors;
   (c) acquiring a field echo signal which is sensitive to shim errors at a time interval equal to a multiple of an amount of time it takes for fat and water signals to become in-phase;
   (d) comparing a temporal position of a maximum of the field echo signal to its predicted temporal position relative to the reference signal;
   (e) calculating a shim term based on the comparison of step (d);
   (f) applying an electrical current to one of a gradient offset and a shim coil such that the main magnetic field is adjusted according to the shim term.

2. The method of claim 1, wherein the step of generating includes generating at least first, second, and third radio frequency pulses, the first radio frequency pulse being a 90 degree pulse.

3. The method of claim 2, wherein the second and third radio frequency pulses are 90 degree pulses.

4. The method of claim 2, wherein the second and third radio frequency pulses are 180 degree pulses.

5. The method of claim 1, wherein the resulting reference signal and the resulting field echo signal are read out with gradient polarities that are the same.

6. The method of claim 1, wherein the reference signal and the field echo signal are produced from a common excitation signal.

7. The method of claim 1, wherein steps (a) through (f) are repeated a number of times until the main magnetic field is within a predetermined tolerance.

8. The method of claim 1, wherein the reference signal is one of a stimulated echo and a spin echo.

9. The method of claim 1, wherein steps (a) through (f) are repeated a plurality of times for at least three mutually orthogonal axes.

10. The method of claim 9, wherein steps (a) through (f) are repeated for an axis until the magnetic field along that axis is within a predetermined tolerance before moving on to another axis.

11. The method of claim 9, wherein steps (a) through (f) are performed once for each axes in turn and then repeated for each axes in turn until the magnetic field is within a predetermine tolerance.

12. The method of claim 1, wherein the shim term is a linear shim term.

13. In a magnetic resonance method in which a temporally constant magnetic field is generated in an examination region, a subject is placed in the temporally constant field, thereby distorting it, radio frequency pulses excite and manipulate resonance of dipoles in the subject, magnetic field gradients encode the excited resonance, and excited, manipulated, and encoded resonance is read out and processed, a method of compensating for distortions in the temporally constant magnetic field comprising:

applying a series of the radio frequency pulses which excite resonance in a selected plane which is subject to the distortions, de-sensitizing the resonance to the distortions in the selected plane, and re-sensitizing the resonance to the distortions in the selected plane;

inducing a first magnetic resonance echo that is insensitive to the distortions in the selected plane;

inducing a second magnetic resonance echo which is sensitive of the distortions in the selected plane, a projected time interval after the first echo;

measuring an actual time interval between the first and second echoes;

adjusting the temporally constant magnetic field along the selected plane in accordance with a difference between the actual and projected time intervals.

14. The method of claim 13, wherein the method is repeated until the distortions fall within a predetermined tolerance, such that for a number of first repetitions the projected time interval is less that a time it takes for fat and water signals to become in-phase, and for at least one fine tuning repetition the projected time interval is the same as the time it takes for fat and water signals to become in-phase.

15. In a magnetic resonance imaging apparatus including a couch which supports a subject being examined within an examination region, a main magnet that generates through the examination region a temporally constant main magnetic field having distortions, a magnetic field gradient generator having gradient coils and connected gradient amplifiers which supply electrical current pulses to the gradient coils to create substantially linear magnetic gradients in the main magnetic field, a radio frequency transmission system having an RF coil and connected transmitter for generating a radio frequency pulse sequence which excites magnetic resonance in magnetic dipoles of the subject, a radio frequency reception system having an RF coil and connected receiver for receiving magnetic resonance signals from excited magnetic dipoles as they relax, and a signal processor for processing received magnetic resonance signals into a human readable form, a magnetic shimming system that compensates for the distortions to the main magnetic field comprising:

a sequence control circuit which manipulates the magnetic gradient generator, to induce a shimming series of gradient lobes along a read out axis, and the radio frequency transmission system, to induce a shimming series of radio frequency pulses, such that a shimming magnetic resonance signal is produced by excited magnetic dipoles as they relax, the shimming magnetic resonance signal received by the reception system has a plurality of echos including at least;

a first echo immune to the distortions to the main magnetic field; and, a second echo sensitized to the distortions to the main magnetic field, which is received at a time interval after the first echo equal to a multiple of an amount of time it takes for fat and water signals to become in-phase;

a shim term generator that calculates a shim term based on a temporal position of a maximum of the second echo as compared to its predicted temporal position relative to a temporal position of a maximum of the first echo; and, a shimming mechanism that carries an electrical current such that the distortions to the main magnetic field are compensated for according to the shim term.

16. The magnetic shimming system of claim 15, wherein the shimming series of radio frequency pulses includes at least first, second, and third radio frequency pulses, the first radio frequency pulse having a 90 degree flip angle.

17. The magnetic resonance shimming system of claim 16, wherein the second and third radio frequency pulses both have one of a 90 degree flip angle and a 180 degree flip angle.

18. The magnetic resonance shimming system of claim 15, wherein the first and second echos are received by the reception system under gradient lobes having the same polarity.

19. The magnetic resonance shimming system of claim 15, wherein:

the first echo is one of a stimulated echo and a spin echo; and, the second echo is a field echo.

20. The magnetic resonance shimming system of claim 15, wherein the shim term is a linear shim term.

* * * * *